United States Patent
DuBois et al.

[11] Patent Number: 5,855,687
[45] Date of Patent: Jan. 5, 1999

[54] SUBSTRATE SUPPORT SHIELD IN WAFER PROCESSING REACTORS

[75] Inventors: Dale R. DuBois, Los Gatos; Alan F. Morrison, San Jose, both of Calif.; Richard A. Marsh, Austin, Tex.; Mei Chang, Cupertino, Calif.

[73] Assignee: Applied Materials, Inc., Santa Clara, Calif.

[21] Appl. No.: 326,506

[22] Filed: Oct. 20, 1994

Related U.S. Application Data

[60] Continuation-in-part of Ser. No. 218,209, Mar. 25, 1994, which is a division of Ser. No. 823,942, Jan. 22, 1992, Pat. No. 5,304,248, which is a continuation-in-part of Ser. No. 622,664, Dec. 5, 1990, abandoned.

[51] Int. Cl.$^6$ .......................... C23C 16/00; C23C 14/00; C23F 1/00; H01L 21/00
[52] U.S. Cl. .......................... 118/729; 118/725; 118/728; 118/730; 118/719; 118/500; 118/503; 156/345; 204/298.11
[58] Field of Search .................................. 118/719, 725, 118/728, 729, 730, 500, 503; 156/345; 204/298.11

[56] References Cited

U.S. PATENT DOCUMENTS

| | | | |
|---|---|---|---|
| 4,978,412 | 12/1990 | Aoki et al. | 156/345 |
| 4,990,374 | 2/1991 | Keeley et al. | 427/255.1 |
| 5,033,407 | 7/1991 | Mizuno et al. | 118/725 |
| 5,238,499 | 8/1993 | van de Ven et al. | 118/724 |
| 5,262,029 | 11/1993 | Erskine et al. | 204/298.15 |
| 5,292,554 | 3/1994 | Sinha et al. | 427/251 |
| 5,304,248 | 4/1994 | Cheng et al. | |
| 5,328,722 | 7/1994 | Ghanayem et al. | 427/250 |
| 5,352,294 | 10/1994 | White et al. | 118/725 |
| 5,421,401 | 6/1995 | Sherstinsky et al. | 165/80.2 |
| 5,437,757 | 8/1995 | Rice et al. | 156/345 |
| 5,476,548 | 12/1995 | Lei et al. | 118/728 |
| 5,518,593 | 5/1996 | Hosokawa et al. | 204/192.12 |
| 5,534,072 | 7/1996 | Mizuno et al. | 118/728 |
| 5,534,110 | 7/1996 | Lenz et al. | 156/643.1 |
| 5,540,821 | 7/1996 | Tepman | 204/192.3 |
| 5,576,059 | 11/1996 | Beinglass et al. | 427/255 |
| 5,578,532 | 11/1996 | van de Ven et al. | 437/245 |
| 5,611,865 | 3/1997 | White et al. | 118/725 |
| 5,620,525 | 4/1997 | van de Ven et al. | 118/728 |
| 5,643,366 | 7/1997 | Somekh et al. | 118/721 |
| 5,725,718 | 3/1998 | Banholzer et al. | 156/345 |

FOREIGN PATENT DOCUMENTS

| | | |
|---|---|---|
| 0 467 623 | 1/1992 | European Pat. Off. . |
| 0 553 691 | 8/1993 | European Pat. Off. . |
| 0 606 751 | 7/1994 | European Pat. Off. . |
| 0 619 381 | 10/1994 | European Pat. Off. . |
| 3-013577 | 1/1991 | Japan . |

*Primary Examiner*—R. Bruce Breneman
*Assistant Examiner*—Jeffrie R. Lund
*Attorney, Agent, or Firm*—Cooley Godward LLP; Craig P. Opperman, Esq.; Robert W. Mulcahy

[57] ABSTRACT

Apparatus for CVD processing wherein a wafer mounted on a vertically movable susceptor beneath a showerhead. The susceptor extends beyond the outer perimeter of the wafer such that, when the susceptor is raised into contact with a shield ring which normally rests on a ring support in the chamber, the shield ring engages outer portion of the susceptor beyond the perimeter of the wafer, lifting the shield ring off its support. The shield ring shields the edge of the top surface of the susceptor during the deposition, whereby unwanted deposition on the susceptor is prevented while, at the same time, allowing for deposition over the entire upper surface of the wafer. To center the shield ring and the susceptor with respect to each other, the shield ring may include a plurality of centering protrusions, at least some of which engage the susceptor as it moves upwards to lift the shield ring off its supports in the chamber.

11 Claims, 3 Drawing Sheets

SUBSTRATE SUPPORT SHIELD IN WAFER PROCESSING REACTORS

CROSS-REFERENCE TO RELATED APPLICATIONS

This application is a continuation-in-part of co-pending U.S. patent application in the name Cheng, et al., Ser. No. 08/218,209, Mar. 25, 1994, which is a divisional of application Ser. No. 07/823,942, Jan. 22, 1992, now issued as U.S. Pat. No. 5,304,248, which is a continuation-in-part of U.S. Ser. No. 07/622,664, Dec. 5, 1990,now abandoned, all of which are assigned to Applied Materials, Inc. of Santa Clara, Calif.

BACKGROUND OF THE INVENTION

1. Field of the Invention

This invention relates to apparatus for chemical vapor deposition (CVD) on semiconductor wafers and, more specifically, to a shield for shielding the upper edge of a susceptor to prevent deposition thereon.

2. Description of Related Art

During the formation of an integrated circuit structure, various layers of materials are deposited on a semiconductor wafer. One of the processes commonly used to achieve this is chemical vapor deposition (CVD).

As disclosed in U.S. Pat. No. 5,304,248, the disclosure of which is incorporated herein by reference, a typical reactor used for CVD processing of a semiconductor wafer is illustrated in FIG. 1. In this CVD reactor, a wafer 10 is supported on a circular susceptor 11 beneath a gas inlet or shower head 12. Processing/deposition gas containing molecules comprising a metallic cation, such as Tungsten, enters the CVD chamber through the shower head 12 and reacts adjacent to the wafer so that the metal is deposited on the face or top surface of the wafer 10.

A shadow ring 13 overhangs and is supported by the edge of the wafer 10.

The shadow ring 13 defines an exclusionary zone, typically 1.5 to 2.0 mm wide around the perimeter of the wafer, onto which no deposition occurs. The purpose of creating this zone is to exclude deposited materials from this zone, the edge and the backside of the wafer and thereby reduce the generation of unwanted particles in the chamber. This is a particularly important where the deposited material does not adhere to such areas.

The deposition of Tungsten is a good example. Tungsten does not readily adhere to certain surfaces and before it is deposited over silicon oxide on a semiconductor wafer, the oxide surfaces must be pretreated for the tungsten being deposited to properly adhere to the surfaces (e.g. by deposition of a Titanium Tungsten (TiW)) or Titanium Nitride (TiN)). Typically, the edge and backside of the wafer surfaces have not been pretreated and any deposited Tungsten would not adhere properly and tend to flake off in particles.

Furthermore, the exclusionary zone also provides a "buffer" zone which, when contacted by wafer handling equipment, does not readily chip or flake as would a fully/or inadequately processed surface. Such chipping and flaking could also result in unwanted particle generation.

As can also be seen from FIG. 1, a pumping ring 14 is located on a supporting lip or shoulder 15 inside the chamber and has an inner diameter such that an annular gap is defined between the ring 14 and the outer edge of the susceptor 11. During processing, a non-reactive purge gas is introduced, at a pressure greater than the pressure of the deposition gas, into the chamber from a position below the susceptor. This purging gas flows from below the susceptor 11 to the region above it through the annular gap. The purpose of the purging gas flow is to inhibit passage of the deposition gas into the region below the susceptor and, thereby, help prevent unwanted deposition on the surfaces of the elements of the reactor that are located in this region.

The shadow ring 13, as is illustrated in this figure, rests on both the susceptor 11 and the pumping ring 14. As such, it partially obstructs the annular gap, defined between the susceptor and the pumping ring, and thereby further controls the flow of purging gas from below to beneath the susceptor.

The problem with the apparatus illustrated in this figure is that it cannot be used in applications where deposition is to occur over the entire surface of the wafer. This is so even if the shadow ring were removed, because of how a wafer is heated in processing reactors. Deposition is effected by, amongst others, the temperature of the wafer. Typically, the susceptor is heated by means of, for example, heater lamps. The heated susceptor then conductively heats the wafer.

In any heated susceptor a certain amount of heat loss will occur at the edges resulting in a temperature drop off toward the edges of the susceptor, with its perimeter regions being cooler than its central region. As the wafer is heated by conduction, susceptor described above, which is approximately the same diameter as the wafer, heats the wafer less at the edges than at the center. This, in turn, leads to non-uniform and less easily controlled deposition over the entire wafer.

Merely enlarging the susceptor does not solve the problem. An enlarged susceptor would have surface areas that are exposed to deposition. Such deposition must be removed, before the next process cycle commences, by means of a cleaning process that usually is achieved by plasma etching. Although plasma etching is very effective on the quartz and alumina components or surfaces in the chamber, the susceptor is made of anodized aluminum. This material is not as resistive to the plasma etch and would rapidly wear away. Accordingly, any deposition on the susceptor which would need to be removed by plasma etching would be very disadvantageous.

Thus, the need exists for a processing apparatus that allows for processing of the entire wafer's surface and that, at the same time, heats the wafer uniformly. In addition, the apparatus should preferably also minimize edge and backside deposition on the wafer, for the reasons set out above.

SUMMARY OF THE INVENTION

Briefly, accordingly to this invention, a single substrate CVD wafer processing reactor includes a chamber housing a wafer supporting susceptor and a shower head for introducing processing gas into the chamber towards the top face of the wafer. The susceptor has an outer diameter that is greater than the outer diameter of the wafer. During processing a shield ring rests on and covers a substantial portion of the susceptor which protrudes beyond the outer perimeter of the wafer. This prevents disadvantageous deposition on the susceptor.

The wafer is typically supported within a pocket in the upper face of the susceptor. A groove is formed in the floor of the pocket at its perimeter and acts both as a "thermal choke" to improve the uniformity of temperature within the portion of the susceptor directly below the wafer and as a receptacle for deposition build-up at the edge of the wafer.

To center the shield ring and the susceptor with respect to each other, the shield ring may include a plurality of centering protrusions, at least some of which engage the susceptor as it moves upwards to lift the shield ring off its supports in the chamber.

Further, features of the present invention will become apparent from the following detailed description when taken in conjunction with the accompanying drawings.

DESCRIPTION OF PREFERRED EMBODIMENT(S)

Figure 1:
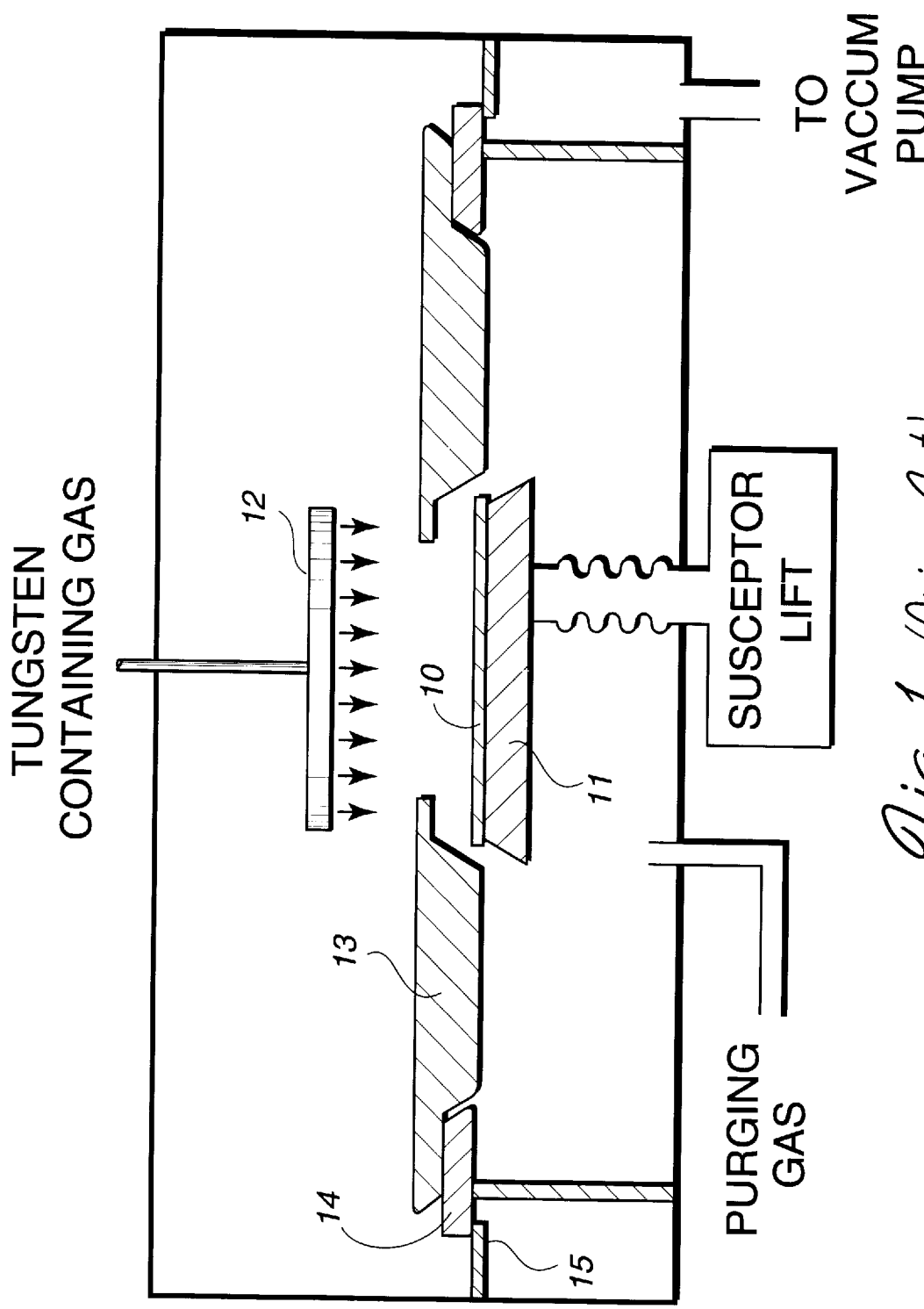
FIG. 1 is a schematic cross section illustrating a prior art reactor.
Figure 2:
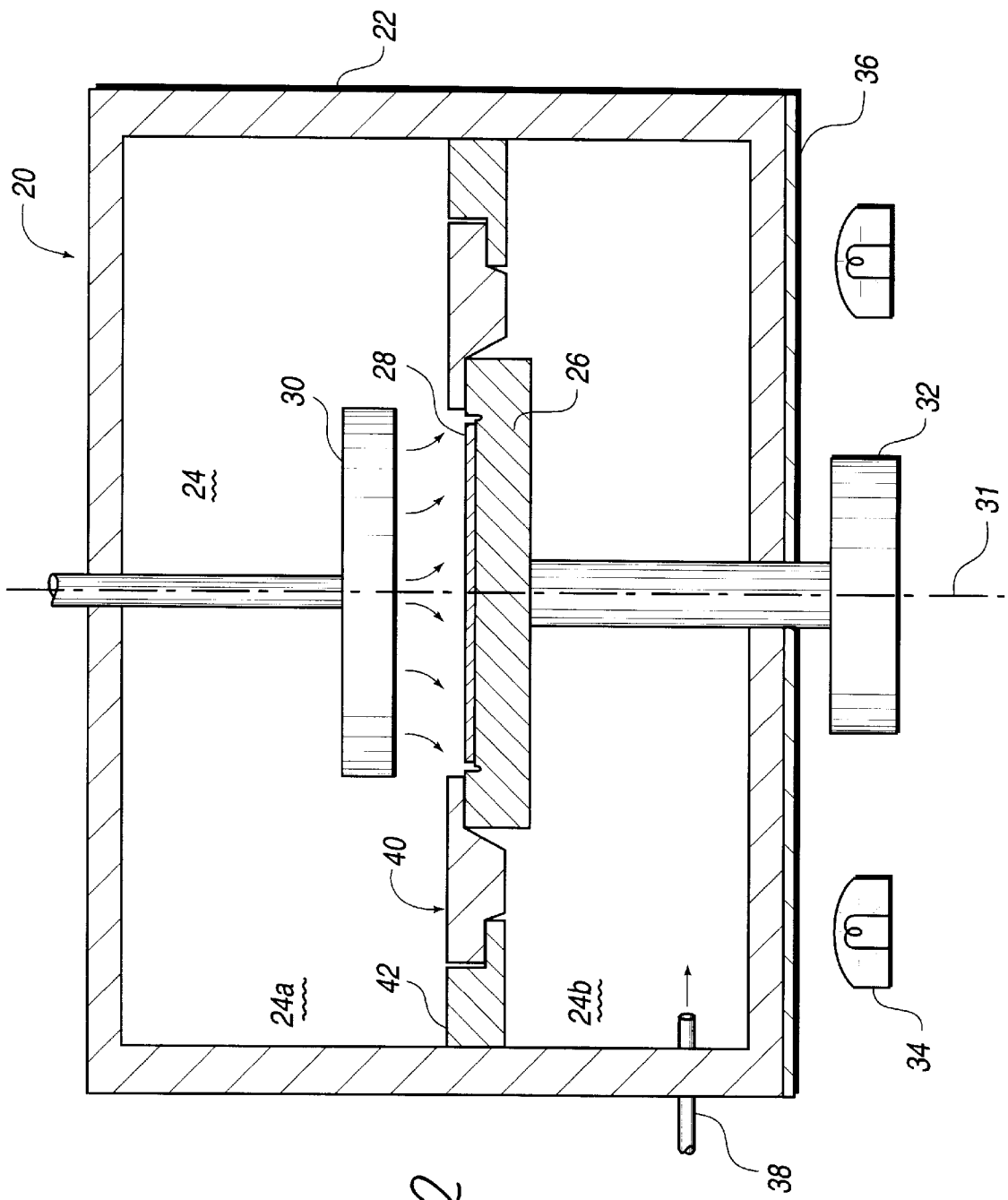
FIG. 2 is a similar cross section illustrating the reactor of the invention.

This invention is generally illustrated with respect to FIG. 2, which is a schematic cross section through a typical single wafer, CVD, semiconductor wafer processing reactor. As illustrated, the reactor 20 includes a housing 22 that defines a processing chamber 24 inside which a susceptor 26 is located.

The susceptor 26 divides the chamber into upper and lower portions 24a and 24b, respectively. The susceptor supports on its upper surface a semiconductor wafer 28 beneath a shower head 30 having a planar array of closely spaced apertures through which gas containing metal atoms can be injected into the chamber 24 for deposition on the wafer 28. Further, the susceptor 26 is moveable vertically along and is rotatable about a central axis 31 that is perpendicular to the primary plane of the wafer 28, under action of a lift mechanism 32. During wafer processing, the susceptor and the chamber interior are heated by radiant energy sources such as heater lamps 34 located below the housing 22 or alternatively by a resistive heater in the susceptor 26. To facilitate the radiant heating, the lower wall 36 of the housing 22 is of a material, such as quartz, which is transparent to radiant energy from the heater lamps 34. The heated susceptor 26, in turn, heats the wafer 28, at least partially through conduction.

Further, as illustrated in this figure, the susceptor has a larger diameter than the wafer. Typically, for a 150 mm wafer, the susceptor will have a diameter of 6.394 inches (163 mm) leaving a projecting portion beyond the outer perimeter of the wafer. A shield ring 40 is positioned around the outer perimeter of the susceptor 26. When the reactor is idle, the shield ring 40 rests on a pumping plate 42. The pumping plate 42, in turn, is secured to the outer wall of the chamber 24 in a conventional manner at a point approximately 1" (25.4 mm) below the shower head 30. During deposition of metal or other material onto the wafer, however, the shield ring 40 is lifted off the pumping plate 42 by the susceptor 26 and is supported by the peripheral projecting portion of the susceptor 26.

This figure also illustrates that the housing 22 includes a purge gas inlet 38 through which purge gas is injected into the lower portion 24b of the chamber.

Figure 3:
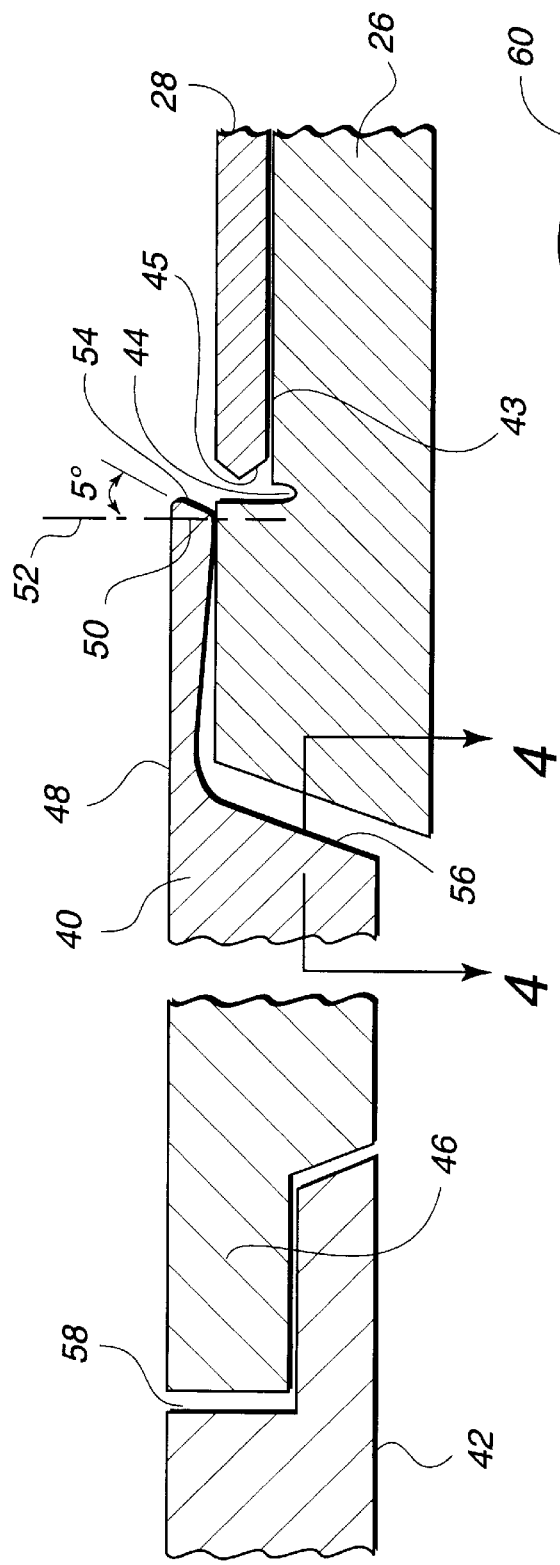
FIG. 3 is a cross sectional detail of the interface between the shield ring and the susceptor further illustrating the invention.

The susceptor 26 and the shield ring 40 are illustrated in greater detail with reference to FIG. 3, which is an enlarged cross section of these components. It should be noted here that the specific dimensions given below with respect to this figure are illustrative in nature and should accordingly not be seen as limiting the concept of this invention.

From this figure it can be seen that the susceptor 26 includes a recessed pocket 43 formed therein. This pocket is sized to receive the wafer 28 and is dimensioned to have a slightly larger diameter and be slightly deeper than the wafer's diameter and thickness, respectively. So, for example, for a wafer that is 150 mm in diameter, the pocket may have an interior diameter of 5.995" to 6.0" (152.27 to 152.40 mm). Typically, such 150 mm wafer is 0.028" to 0.034" inches (0.711 to 0.864 mm) thick. In this case the corresponding pocket would be 0.035" to 0.040" (0.889 to 1.016 mm) deep.

At the peripheral edge of the pocket 43 a groove 44 of semi-circular cross-section is cut into its floor. This groove is peripherally approximately 0.035" to 0.040" (0.889 to 1.016 mm) wide at the top and formed with a radius of approximately 0.018 to 0.020" (0.457 to 0.508 mm). Preferably, the groove 44 the wafer edge bevel 45.

The groove 44 has two functions. Firstly, it functions as a thermal "choke" as it reduces the cross section of the susceptor 26 at the perimeter of the wafer. It is known that thermal conduction within a body of material, such as the susceptor 26, is related to the cross section of the material making up the body. As the cross sectional area of the material decreases so too does its ability to transfer thermal energy (heat) across such zone of decreased cross sectional area. As described above, the susceptor 26 heats the wafer 28 by conduction, at least within the susceptor itself. In CVD applications it is generally preferable for the wafer 28 to be uniformly heated across its entire surface. To best achieve this, the portion of the susceptor 26 located directly below the wafer 28 should have a uniform temperature. The groove 44, in reducing the cross sectional area of the susceptor at the perimeter of the wafer, and thereby acting as a thermal choke, assists in this. If it were not for the thermal choke effect of the groove 44, the temperature of the susceptor 26, which would otherwise naturally drop off towards its outer perimeter, would reduce from within the portion of the susceptor 26 beneath the wafer 28.

Secondly, and as will be described below, the groove acts to receive deposition which would otherwise build up at the edge of the wafer. This deposition build-up could detrimentally lift the wafer off the susceptor's surface resulting in unwanted backside deposition and possible effecting the heating of the wafer by conduction from the susceptor.

The shield ring 40 is typically 0.2" (5.08 mm) thick across its thickest portion. In applications with 150-mm diameter wafers, the internal diameter of the ring 40 is slightly greater than 150 mm and the maximum external diameter of the ring 40 is approximately 7.808" (195.2 mm). Along its outer edge, the ring 40 has a first step 46 formed in its bottom surface. This first step, which is typically 0.064" (1.63 mm) thick and approximately 0.621 " (15.78 mm) wide, is shaped to interact with a complementarily shaped step formed in the top of pumping plate 42.

At the inner edge of the shield ring 40, a second step is formed in the bottom surface to define a roof 48 overhanging the susceptor. The overhanging roof portion is approximately 0.62 inches (15.75 mm) wide and 0.035" (0.89 mm) thick at its thickest portion 50, being is the portion of the roof 48 closest to the central axis 31. During processing, this thickest portion of the roof 48 engages the susceptor 26 at a line of contact 52. The roof 48 tapers at approximately 0° 3.3' away from the susceptor 26 to become thinner in cross section further away from the central axis 31. This arrangement ensures that the shield ring 40 contacts the susceptor 26 at the line of contact 52 as close to the wafer as possible and, thereby, minimizes deposition on the upper surface of the susceptor 26. To further reduce deposition on the upper surface of susceptor 26, the interior edge 54 of the roof 48 slopes inwardly and upwardly from the line of contact 52 at an angle of approximately 5° from the vertical. This creates a "shadow" on the susceptor 26 which reduces deposition on any exposed portions of the upper surface of the susceptor 26. It also reduces the amount of deposition in the groove 44 formed at the edge of the pocket 43.

Finally, this figure shows that the inner face 56 of the main body of the shield ring 40 is sloped downwardly and outwardly. In practice, this slope is at an angle of approximately 30°. This sloping inner face 56 is generally parallel with a sloping outer surface of the susceptor 26 and serves to assist centering the susceptor within the shield ring 40 as the susceptor 26 is moved up and down during processing cycles.

Figure 4:
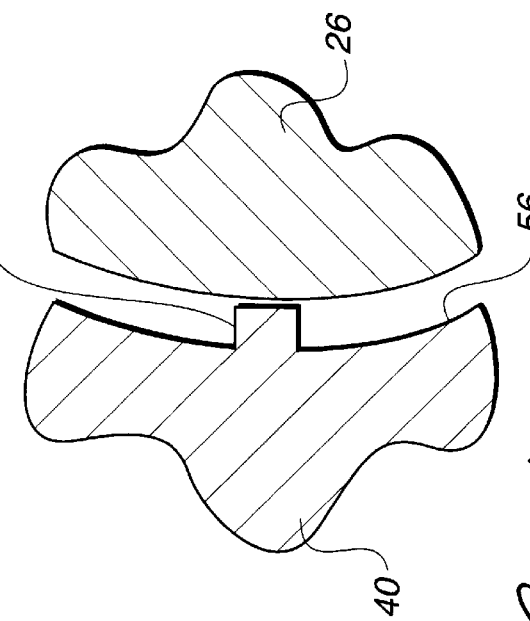
FIG. 4 is sectional detail of the shield ring taken along line 4—4 in FIG. 3.

To further ensure that the susceptor 26 and the shield ring 40 are appropriately centered with respect to each other, the shield ring 40 includes six tabs 60, one of which is illustrated plan cross-section in FIG. 4. These six tabs 60 are equally spaced around the inner face 56 of the shield ring 40 and extend generally vertically upward along the entire inward sloping surface 56 of the shield ring 40. Typically, these tabs are 0.09 inches (2.286 mm) in cross sectional width and protrude 0.10 inches (0.25 mm) toward the center of the wafer from the sloping face 56. It has been found that, as the susceptor 26 moves up to engage the shield ring 40, at least three of these tabs 60 make contact with the sloping outer surface 56 of the susceptor. This has two advantages. Firstly, the tabs 60 provide point contacts which substantially reduce the "heat sink" effect of the shield ring 40 by substantially reducing the contact area available for conductive transfer of heat between the susceptor 26 and the shield ring 40. This substantially reduced area of contact also reduces the chance of sticking between the shield ring and the susceptor 26. Secondly, these tabs 60 serve, as indicated above, to center the shield 40 and the susceptor 26 with respect to each other. These tabs 60 increase the machining tolerances and provide, at a minimum, a stable, three point contact between the susceptor 26 and the shield ring 40.

Referencing again to FIG. 2, the reactor 20 described above operates as follows. To commence processing, the susceptor 26 moves downwardly under action of lift 32 into the lower portion 24b of the chamber 20. A wafer 28 is inserted into the chamber and placed onto the susceptor 26 by conventional robot arm and lift pins (not shown). The susceptor 26 then moves back up to make contact, at line of contact 52, with the shield ring 40. As the susceptor 26 moves upwardly, and as described above, the six tabs 60 located along the inner face 56 of the shield ring ensure that the shield ring is properly centered with respect to the susceptor 26.

As the susceptor 26 continues to move upwardly it lifts the shield ring 40 slightly up from the pumping plate 42 to form a serpentine space 58 between the shield ring 40 and the pumping plate 42. At a point when the wafer is approximately 0.250" to 0.500" (6.35 to 12.7 mm) from the shower head 30, the susceptor 26 stops and processing is initiated. The interior of chamber and, more particularly, the susceptor 26 are heated by means of radiant energy from the heater lamps 34. As the susceptor heats up, it heats the wafer 28 by means of conduction. To ensure uniformity of heating and uniformity of deposition, the susceptor 26 is rotated about the central axis 31. This rotation is achieved by conventional means by a lift mechanism 32 which can further rotate.

Once the susceptor 26 has reached a suitable temperature, as determined by means of temperature sensor means such as non-illustrated pyrometers, purge gas is introduced into the lower portion 24b of the chamber 20 via the purge gas inlet 38 at a somewhat higher pressure than that of the processing gas in the upper portion 24a. At about that time, deposition of metal atoms (typically Copper or Tungsten) onto the upper surface of the wafer 28 commences by introducing gas containing the metal atoms into the chamber 24 through the shower head 30. The deposition gas is typically introduced at a pressure slightly less than the purge gas. As a result, the purge gas flows from the lower portion 24b to the upper portion 24a of the chamber, via the space 58 (FIG. 3) between the faces of the complementary step formations formed in the shield ring 40 and pumping plate 42, respectively. As the shower head 30 is approximately 25.4 mm above the pumping plate and the wafer is lifted to a point 6.35 to 12.7 mm below the shower head, the gap between the horizontal face of step formation 46 and the pumping ring 42 is about 12.7 to 19 mm. This has the advantage that the deposition gas is prevented from penetrating the lower portion 24b of the chamber 24. If the gas did penetrate, it would produce unwanted deposition on the components in the lower portion 24b.

During deposition and as described above, the shield ring 40 shields the upper face of the susceptor 26. Deposition is prevented in all areas of the susceptor 26 which lie "behind" (radially outward of) the line of contact 52. In addition, the upwardly and inwardly sloping interior edge 54 of the roof 48 also "shadows" the upper surface of the susceptor 26 and at least a part of the groove 44. Nonetheless, some deposition does occur within the groove 44. This illustrates a second function (apart from the thermal "choke" effect) of the groove 44. It acts as a receptacle for deposited material which occurs around the edge of the wafer 28. If it were not for the groove 44, such deposition would cause a build up at the edge of the wafer which may lift the wafer slightly off the susceptor 26. As described, this could have the detrimental effect of reducing the contact between the wafer and the susceptor 26 which could effect the conduction of heat between the susceptor and wafer. It could also allow deposition gas to seep in underneath the wafer 28 and, thereby, cause what is known in the industry, as "backside burn."

Such backside burn or deposition on the backside of the wafer is generally unacceptable from a quality control point of view. Any deposition in the groove 44 can be etched away during plasma etch cleaning. Although such plasma etch cleaning is detrimental to the flat upper surface, it is not so detrimental to the groove. This is because the groove can be etched away without adversely effecting its functions or that of the susceptor.

Finally, during the deposition process, purge gas and spent deposition gas is evacuated from the upper portion 24a of the chamber 24 by means of an evacuation port (not shown) in the conventional manner. The inventive apparatus of this invention has, therefore, a number of advantages. The roof 48 of the shield ring 40 prevents deposition of material on the upper portion of the upper face of the susceptor 26 which is protruding beyond the outer edge wafer 28. To further enhance the shielding effect of the roof 48, its inner edge slopes inwardly and upwardly as described above.

In addition, the susceptor 26 has a larger diameter than the wafer 28. This results in a more uniform heating of the wafer as the temperature drop off towards the edge of the susceptor occurs in the portion of susceptor which lies beyond the outer edge of the wafer 28. The groove 44 operates to ensure that the temperature drop-off occurs beyond the edge of the wafer 28.

The groove 44 has a further advantage in that it acts as a trap for deposition build up around the edge of the wafer 28. Finally, another advantage of the apparatus described, is that purge gas, which is at a higher pressure than the deposition gas, is able to pass from the lower to the upper portions of the chamber 24 via the space 58 between the shadow ring 40 and its supporting ring 42. This prevents deposition on the surfaces of the components located within the lower portion 24b of the chamber 24.

Although the foregoing invention has been described in some detail by way of illustration and example for purposes of clarity of understanding, certain changes and modifications may be practiced within the scope of the claims. Accordingly, this invention should not be limited by the specific description but should rather be interpreted in the light of the claims.

What is claimed is:

1. An apparatus for processing a substrate having a diameter comprising:
   (a) a housing defining a substrate processing chamber;
   (b) a susceptor, located within the chamber, for receiving and supporting the substrate with one face thereof exposed for processing and having a diameter greater than the diameter of the substrate;
   (c) a susceptor circumscribing shield including a body and a roof overhanging an annular peripheral portions of the susceptor, the body defining a first susceptor receiving aperture dimensioned to receive the susceptor therein and the roof defining a second aperture having a diameter larger than the diameter of the substrate; and
   (d) a susceptor lift for moving the susceptor with respect to the shield along an axis of symmetry perpendicular to the exposed face of the substrate into the first aperture and into engagement with the overhanging roof such that a wafer supported centrally on the susceptor is exposed to a processing environment through the second aperture, wherein the roof is engaged by the susceptor at a line of contact adjacent to the radially inward edge of said roof, wherein a spaced is formed between said susceptor and said roof radially outwardly of said line at contact.

2. The apparatus as recited in claim 1, wherein the roof includes an inner face defining an interior acute angle with respect to the exposed face of the wafer.

3. The apparatus as recited in claim 1, wherein said roof has an enlarged cross-sectional area at said line of contact.

4. The apparatus as recited in claim 1, further comprising an annular pumping ring having an interior diameter greater than the diameter of the susceptor and symmetrically arranged about the axis of symmetry within the chamber for defining an annulus between itself and the susceptor.

5. The apparatus as recited in claim 4, wherein the susceptor shield includes an outer edge having a first step formed therein and the pumping ring includes an inner edge having a second step formed therein, the first and second steps being formed to mate with one another.

6. The apparatus as recited in claim 1, wherein the susceptor receiving aperture includes an inner face on which a plurality of inwardly projecting protrusions are arranged.

7. The apparatus as recited in claim 1, wherein the susceptor includes:
   (a) a substrate receiving pocket in an upper surface thereof, the pocket having a floor and generally upright sides and being sized to receive the substrate therein, and
   (b) a circumscribing groove formed into the floor of the pocket and being dimensioned so that, when the substrate is received and centered in the pocket, the groove lies at the perimeter of the substrate.

8. The apparatus as recited in claim 7, wherein the receiving pocket is approximately as deep as the thickness of a substrate received therein.

9. The apparatus as recited in claim 7, further comprising:
   (a) a process gas inlet for introducing substrate processing gas into the chamber of a first pressure; and
   (b) a purge gas inlet for introducing purge gas into the chamber at a second pressure greater than the first pressure.

10. The apparatus as recited in claim 9, further comprising an annular pumping ring having an interior diameter greater than the diameter of the susceptor and symmetrically arranged about the axis of symmetry within the chamber for defining an annulus between itself and the susceptor.

11. The apparatus as recited in claim 10, wherein the susceptor, the shield and the pumping ring are arranged, during processing, to divide the chamber into upper and lower portions and the purge and process gases are introduced into the lower and upper portions of the chamber, whereby purge gas flows from the lower to the upper portion of the chamber through the annulus.

* * * * *